US008610210B2

(12) United States Patent
Ohta et al.

(10) Patent No.: US 8,610,210 B2
(45) Date of Patent: Dec. 17, 2013

(54) POWER SEMICONDUCTOR DEVICE AND METHOD FOR MANUFACTURING SAME (75) Inventors: Hiroshi Ohta, Hyogo-ken (JP); Yasuto Sumi, Hyogo-ken (JP); Kiyoshi Kimura, Hyogo-ken (JP); Wataru Sekine, Ishikawa-ken (JP); Wataru Saito, Kanagawa-ken (JP); Syotaro Ono, Kanagawa-ken (JP); Munehisa Yabuzaki, Hyogo-ken (JP); Nana Hatano, Kanagawa-ken (JP); Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 515 days.

(21) Appl. No.: 12/840,201

(22) Filed: Jul. 20, 2010

(65) Prior Publication Data
US 2011/0018055 A1     Jan. 27, 2011

(30) Foreign Application Priority Data
Jul. 21, 2009   (JP) ................. 2009-170450

(51) Int. Cl.
*H01L 29/66* (2006.01)
(52) U.S. Cl.
USPC ................. 257/341; 257/401; 257/E29.2
(58) Field of Classification Search
USPC .................................. 257/341, 401
See application file for complete search history.

(56) References Cited

U.S. PATENT DOCUMENTS

| | | | | |
|---|---|---|---|---|
| 6,274,904 B1 * | 8/2001 | Tihanyi | | 257/329 |
| 6,762,455 B2 * | 7/2004 | Oppermann et al. | | 257/335 |
| 7,161,209 B2 | 1/2007 | Saito et al. | | |
| 7,317,225 B2 | 1/2008 | Saito et al. | | |
| 2005/0280086 A1 | 12/2005 | Saito et al. | | |
| 2006/0151831 A1 | 7/2006 | Ninomiya et al. | | |
| 2006/0197152 A1 * | 9/2006 | Tokano et al. | | 257/341 |
| 2007/0040217 A1 | 2/2007 | Saito et al. | | |
| 2007/0138543 A1 * | 6/2007 | Saito | | 257/328 |
| 2008/0246079 A1 * | 10/2008 | Saito et al. | | 257/328 |

FOREIGN PATENT DOCUMENTS

| | | |
|---|---|---|
| JP | 2006-186108 | 7/2006 |
| JP | 2008-078282 | 4/2008 |

OTHER PUBLICATIONS

Japanese Office Action dated Jun. 7, 2013, filed in Japanese counterpart Application No. 2009-170450, 4 pages (with translation).

* cited by examiner

*Primary Examiner* — Matthew Reames
(74) *Attorney, Agent, or Firm* — Patterson & Sheridan, LLP (57) ABSTRACT

According to one embodiment, a power semiconductor device includes a first semiconductor layer, and first, second and third semiconductor regions. The first semiconductor layer has a first conductivity type. The first semiconductor regions have a second conductivity type, and are formed with periodicity in a lateral direction in a second semiconductor layer of the first conductivity type. The second semiconductor layer is provided on a major surface of the first semiconductor layer in a device portion with a main current path formed in a vertical direction generally perpendicular to the major surface and in a terminal portion provided around the device portion. The second semiconductor region has the first conductivity type and is a portion of the second semiconductor layer sandwiched between adjacent ones of the first semiconductor regions. The third semiconductor regions have the second conductivity type and are provided below the first semiconductor regions in the terminal portion.

11 Claims, 7 Drawing Sheets

POWER SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2009-170450, filed on Jul. 21, 2009; the entire contents of which are incorporated herein by reference.

FIELD

Embodiments described herein relate generally to a power semiconductor device and a method for manufacturing the same.

BACKGROUND

Power semiconductor devices are desired to be of low power consumption in order to reduce power loss. For instance, the power consumption of a vertical power MOSFET, which is one of the power semiconductor devices, greatly depends on the electric resistance of its conduction layer (drift layer) determining the on-resistance. The amount of impurity doping determining the electric resistance of this drift layer cannot exceed a maximum limit depending on the breakdown voltage of the pn junction between the base layer and the drift layer. Thus, there is a tradeoff between the device breakdown voltage (avalanche withstand capability) and the on-resistance, and devices have been optimally designed under this tradeoff. On the other hand, this tradeoff has an intrinsic limit dependent on the device material and structure. Technology development overcoming this limit is the way to realizing low power consumption devices beyond existing power semiconductor devices.

For instance, as a power semiconductor device with the aforementioned tradeoff improved, a MOSFET having a super junction structure (SJ structure) is known in which p-type pillars and n-type pillars are periodically buried in the drift layer. In the SJ structure, by equalizing the amount of charge (amount of impurity) contained in the p-type pillar with that contained in the n-type pillar, a non-doped layer is artificially produced to hold a high breakdown voltage. Furthermore, a current is passed through the highly doped n-type pillar to realize a low on-resistance close to the material limit.

Known methods for forming a SJ structure in the drift layer include the method of forming p-type pillars and n-type pillars in a semiconductor layer by stacking epitaxial growth layers which are selectively doped with impurity by ion implantation, and the method of forming trench grooves in an n-type semiconductor layer and filling the trench grooves with p-type semiconductor to form p-type pillars. In the former, although technically less difficult, it is necessary to repeat ion implantation and epitaxial growth a plurality of times, which causes the problem of high process cost. On the other hand, in the latter, it is necessary to grow a high-quality semiconductor crystal in the trench groove with high aspect ratio, which involves a high level of technical difficulty. However, the latter method is promising for significantly reducing the process cost.

On the other hand, a high breakdown voltage is desirable for stable operation of a power semiconductor device. In particular, it is important to ensure a high breakdown voltage in the terminal portion around the device where the symmetry of the structure is broken. For instance, JP-A-2008-078282 discloses a semiconductor device in which the device breakdown voltage is increased by elongating the p-type pillar in the terminal portion of the MOSFET. However, the problem in using the method for forming a SJ structure by filling trench grooves is that it is difficult to increase the breakdown voltage by varying the length of the p-type pillars exclusively in the terminal portion.

DETAILED DESCRIPTION

In general, according to one embodiment, a power semiconductor device includes a first semiconductor layer, first semiconductor regions, a second semiconductor region and third semiconductor regions. The first semiconductor layer has a first conductivity type. The first semiconductor regions have a second conductivity type, and are formed with periodicity in a lateral direction in a second semiconductor layer of the first conductivity type. The second semiconductor layer is provided on a major surface of the first semiconductor layer in a device portion with a main current path formed in a vertical direction generally perpendicular to the major surface of the first semiconductor layer and in a terminal portion provided around the device portion. The second semiconductor region has the first conductivity type and is a portion of the second semiconductor layer sandwiched between adjacent ones of the first semiconductor regions. The third semiconductor regions have the second conductivity type and are provided below the first semiconductor regions in communication with the first semiconductor regions in the terminal portion.

According to another embodiment, a method for manufacturing a power semiconductor device is disclosed. An impurity doping process is configured to form a plurality of fourth semiconductor regions doped with impurity of a second conductivity type on a first semiconductor layer of a first conductivity type with periodicity in a lateral direction in a terminal portion provided around a device portion with a main current path formed in a vertical direction generally perpendicular to a major surface of the first semiconductor layer. A growth process is configured to form a third semiconductor regions by epitaxial growth of a second semiconductor layer of the first conductivity type and redistribution of the impurity of the second conductivity type doped in the fourth semiconductor regions. An etching process is configured to form trench grooves in the second semiconductor layer with an identical lateral periodicity to the fourth semiconductor regions in the device portion and the terminal portion, and to allow the trench grooves to communicate with the third semiconductor regions in the terminal portion. A filling process is configured to form first semiconductor regions by filling the trench grooves with a semiconductor of the second conductivity type.

Embodiments of the invention will now be described with reference to the drawings. In the following description, a power MOSFET, which is one of the power semiconductor devices, is taken as an example. In the figures, similar elements are labeled with like reference numerals. Furthermore, by way of example, the first conductivity type is n-type, and the second conductivity type is p-type.

First Embodiment

Figure 1:
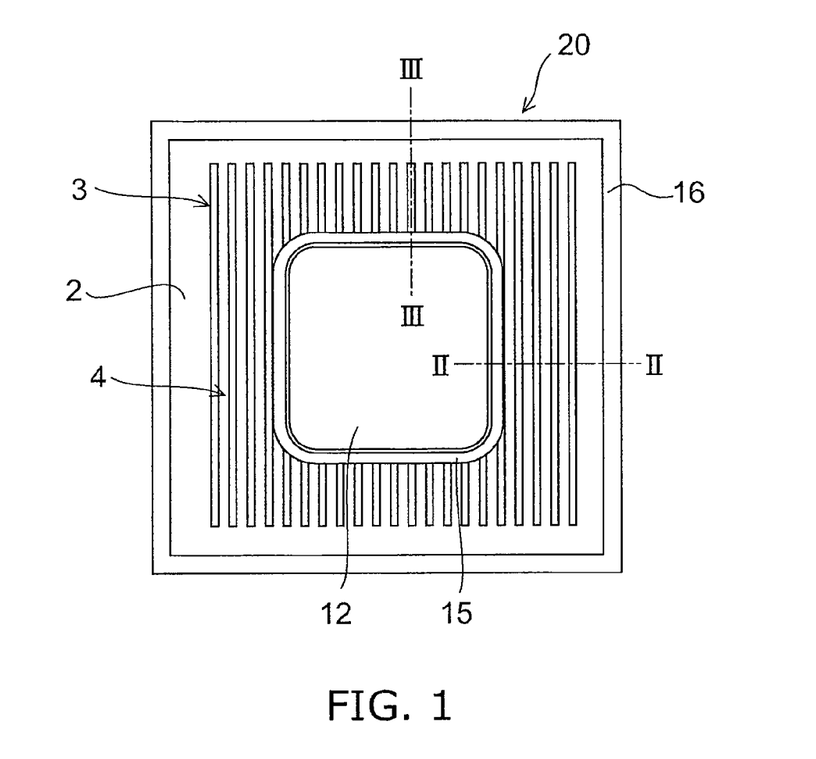
FIG. 1 is a plan view schematically showing a power semiconductor device according to a first embodiment of the invention.

FIG. 1 is a plan view schematically showing a power MOSFET chip 20 according to a first embodiment.

The device portion of the MOSFET is located below a source electrode 12 provided at the center of the chip 20. On the other hand, the terminal portion is provided around the device portion, that is, between a gate electrode 15 provided along the periphery of the source electrode 12 and a field stop electrode 16 provided in the peripheral edge portion of the chip 20.

In this embodiment, p-type pillars 3 and n-type pillars 4 in a striped configuration are periodically located along the chip surface. Furthermore, the p-type pillars 3 and n-type pillars 4 of the device portion located below the source electrode 12 are provided in continuation with, and at the same pitch as, the p-type pillars 3 and n-type pillars 4 shown in the terminal portion in FIG. 1.

Figure 2:
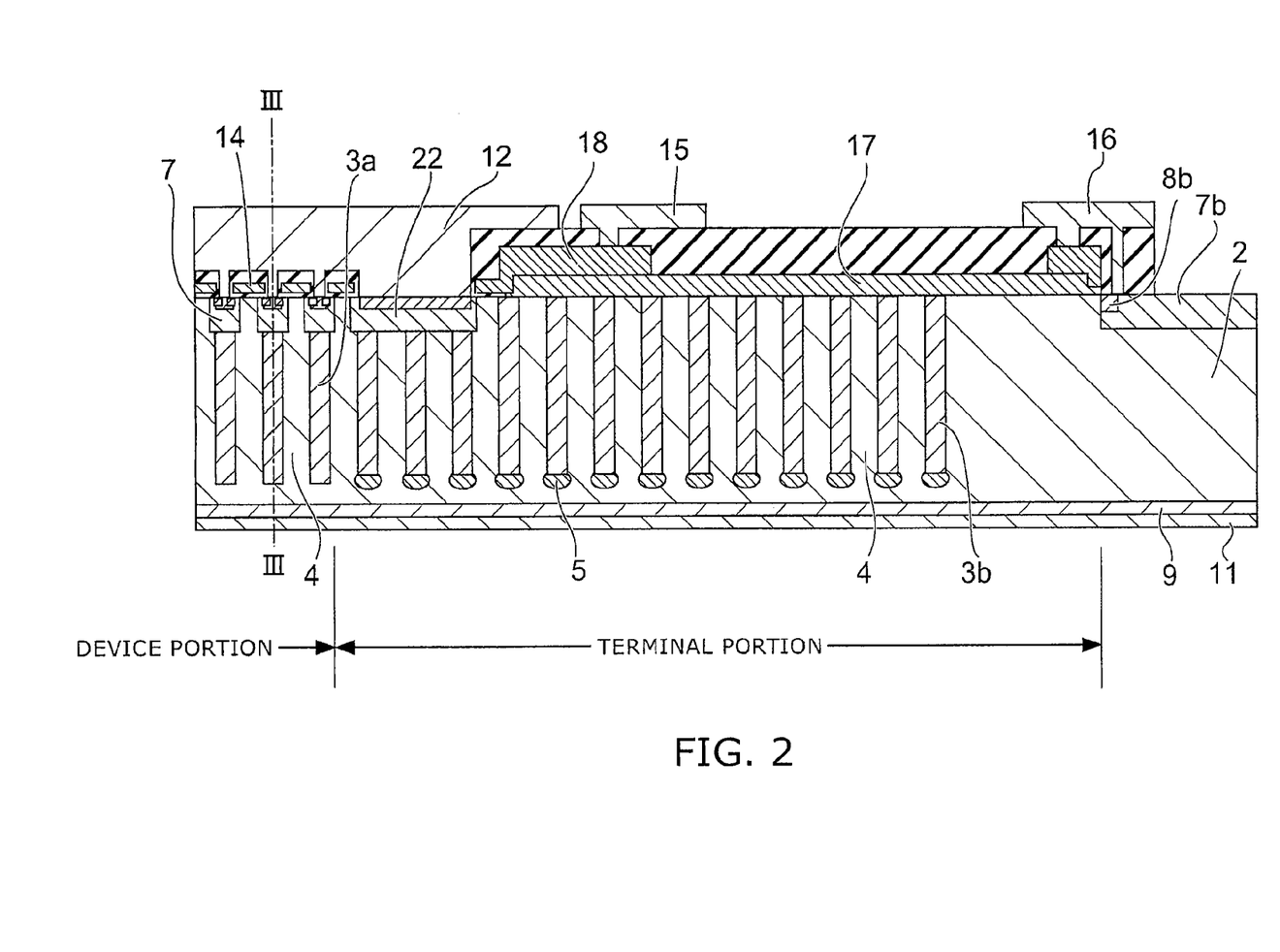
FIG. 2 is a schematic view showing a cross section along II-II of the power semiconductor device according to the first embodiment.
Figure 3:
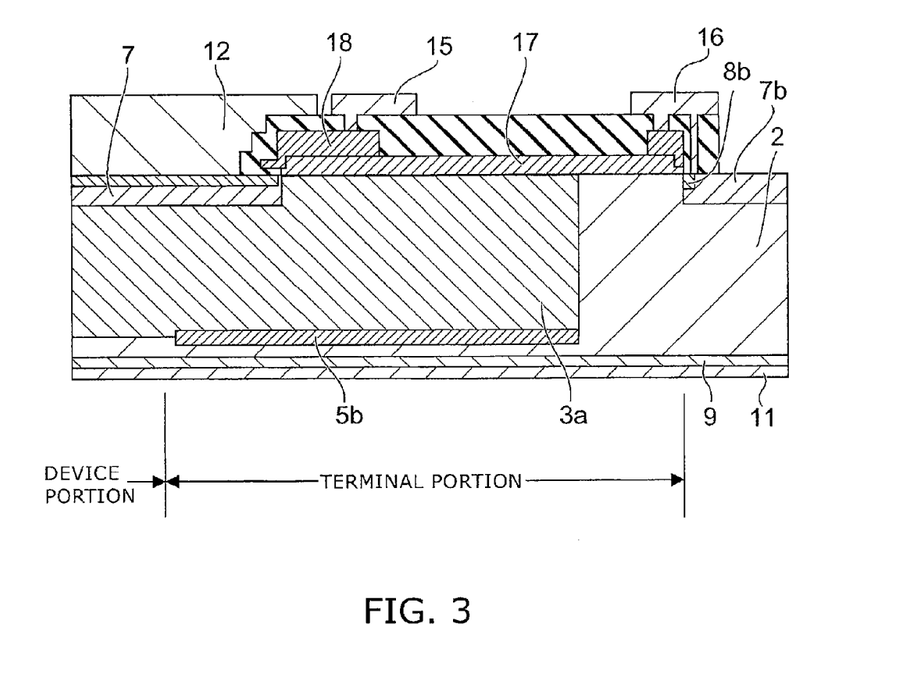
FIG. 3 is a schematic view showing a cross section along III-III of the power semiconductor device according to the first embodiment.

FIGS. 2 and 3 are schematic views showing the cross-sectional structure of the terminal portion taken along lines II-II and shown in FIG. 1. In the following, the structure of the terminal portion of the power MOSFET according to the first embodiment is described.

FIG. 2 is a schematic view showing the cross-sectional structure along II-II in FIG. 1. II-II indicates a cross section, cut in a direction orthogonal to the stripes, of the SJ structure in which the p-type pillars 3 and n-type pillars 4 formed in a striped configuration are periodically arranged.

On an $n^+$-drain layer 9 as a first semiconductor layer, an n-type drift layer 2 as a second semiconductor layer is provided. In the n-type drift layer 2, p-type pillars 3a as first semiconductor regions and n-type pillars 4 as second semiconductor regions are provided with lateral periodicity. Furthermore, the p-type pillars 3a and the n-type pillars 4 are provided with lateral periodicity in the device portion below the source electrode 12. Above the p-type pillars 3a, p-type bases 7 are located on both sides of a gate electrode 14 at the same pitch as the p-type pillars 3a.

On the other hand, in the terminal portion provided around the device portion, p-type pillars 3b connected to p-type base layers 22 (fifth semiconductor regions), and p-type pillars 3b located below a field plate 18 via a field oxide film 17 are provided. Furthermore, a field stop electrode 16 is provided in the peripheral edge portion of the chip and electrically connected to a p-type field stop region 7b and an n-type field stop region 8b. These field stop regions are provided to prevent leak current from occurring in the peripheral edge portion, which has a high density of crystal defects, when the electric field produced by the voltage applied between the drain electrode 11 and the source electrode 12 spreads to the chip periphery.

Furthermore, in the terminal portion, the p-type pillars 3b are provided in communication with p-type regions 5 as third semiconductor regions provided with lateral periodicity. Hence, the p-type pillar 3b of the terminal portion is substantially longer in the direction of the $n^+$-drain layer 9 than the p-type pillar 3a of the device portion without the p-type regions 5, thereby thickening the SJ structure of the terminal portion. Thus, the terminal portion has an increased breakdown voltage corresponding to the increased thickness of the SJ structure. That is, in addition to the terminal structure composed by combination of the p-type base layer 22 and the field plate 18, the SJ structure is thickened so that the breakdown voltage of the terminal portion is increased to realize stable operation of the MOSFET.

FIG. 3 is a schematic view showing the cross-sectional structure along III-III shown in FIGS. 1 and 2, indicating a cross section cut in the stripe direction of the p-type pillars 3. In the terminal portion in this direction, the p-type base 7 extends from the device portion to the neighborhood of the field plate 18, and the p-type pillar 3a also extends to an intermediate position between the gate electrode 15 and the field stop electrode 16. Furthermore, the field plate 18 is connected to the gate electrode 15 (and also connected to the gate electrode 14 in the device portion) so that a high voltage is applied between it and the drain electrode 11. This facilitates extending the depletion region from the device portion toward the terminal portion, and thereby the avalanche withstand capability can be increased.

Furthermore, on the drain electrode 11 side of the p-type pillar 3a communicating with the device portion, a p-type region 5b is provided on the terminal portion side of the boundary between the device portion and the terminal portion. Thus, the thickness of the SJ structure is made larger in the terminal portion than in the device portion, and thereby the breakdown voltage of the terminal portion can be further increased.

Thus, in the first embodiment, the p-type region 5 is formed so as to communicate with the p-type pillar 3b of the terminal portion, and furthermore, in the terminal portion, the p-type region 5b is formed so as to communicate with the p-type pillar 3a, so that the SJ structure is made thicker in the terminal portion than in the device portion to increase the breakdown voltage difference. Such a structure can be easily formed by, for instance, providing the opening of an implantation mask 23 only in the terminal portion, where the p-type regions 5, 5b are to be formed, in the impurity doping process (see FIG. 4A) for ion implantation of p-type impurity. This facilitates partially varying the length of the p-type pillar 3 also in the SJ structure formed by the trench filling process.

In this embodiment, the structure of the terminal portion is configured by combining the p-type base layer 22 and the field plate 18 with the p-type region 5. However, the invention is not limited thereto, but it is understood that the invention can be practiced by combination with other terminal structures such as a RESURF structure. Furthermore, irrespective of the presence or absence of other terminal structures, it is also possible to ensure the breakdown voltage difference relative to the device portion simply by providing a p-type region 5 in the terminal portion.

Figure 4A:
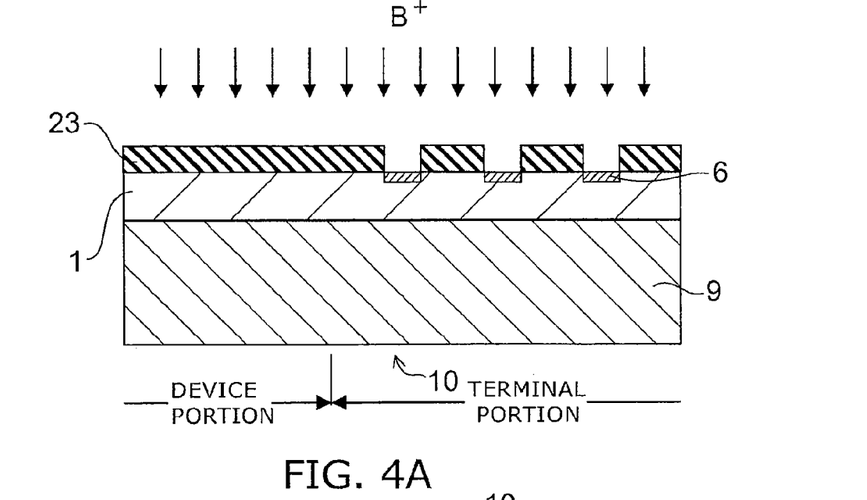
FIGS. 4A and 4B are sectional views schematically showing a process for manufacturing the power semiconductor device according to the first embodiment.

Next, a process for manufacturing a SJ structure according to this embodiment is described with reference to FIGS. 4 and 5. FIG. 4A is a wafer sectional view schematically showing the impurity doping process for ion implantation of boron (B) as p-type impurity.

In this embodiment, boron (B) as p-type impurity is ion implanted into an n-type drift layer 1 formed on an n$^+$-drain layer 9 to form a p-type doped region 6 as a fourth semiconductor region. For instance, a photoresist with openings formed at positions corresponding to the p-type regions 5 of the terminal portion can be used as an implantation mask 23 for selective ion implantation of boron ions (B$^+$).

For charge balance in the SJ structure, the amount of implanted B$^+$ is determined on the basis of the impurity concentration of the n-type drift layer 1. That is, B$^+$ is implanted by the amount which is balanced with the amount of n-type impurity in the depletion region of the n-type drift layer 1 when the p-type region 5 formed by redistribution of boron doped in the p-type doped region 6 is depleted. Furthermore, the implantation energy is illustratively 50-150 keV so that the implantation layer is formed in the n-type drift layer 1.

The n-type drift layer 1 is not limited to a single layer shown in FIG. 4A, but may have a configuration in which a plurality of n-type layers are stacked. Furthermore, in a SJ structure in which the p-type pillar is connected to the n$^+$-drain layer 9, the n-type drift layer 1 may be omitted so that the p-type doped region 6 is formed by direct ion implantation in the surface of the n$^+$-drain layer 9. Furthermore, the method for forming the p-type doped region 6 is not limited to ion implantation, but can be based on vapor phase diffusion and solid phase diffusion. Moreover, the p-type doped region 6 can be formed at an arbitrary position of the device by modifying the opening position and shape of the implantation mask or diffusion mask. Hence, by varying the length of the mask opening along the chip surface, the p-type region 5 communicating with the p-type pillar 3b and the p-type region 5b communicating with the p-type pillar 3a can be easily formed.

Figure 4B:
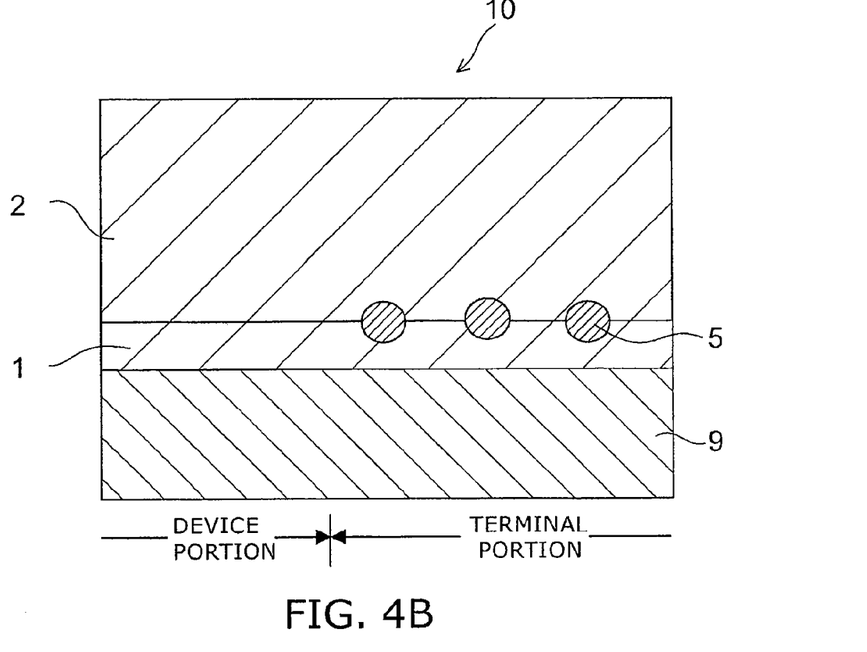

FIG. 4B is a sectional view schematically showing the state in which the n-type drift layer 2 as a second semiconductor layer is epitaxially grown (hereinafter epi-grown) on the n-type drift layer 1.

In the growth process for epi-growing the n-type drift layer 2, epi-growth is performed by heating the wafer 10 to a growth temperature. At this time, boron ion-implanted into the p-type doped region 6 is activated into p-type impurity and redistributed in the n-type drift layer 1 and the epi-grown n-type drift layer 2. Thus, as shown in FIG. 4B, p-type regions 5 are formed with lateral periodicity at the boundary between the n-type drift layer 1 and the n-type drift layer 2.

For instance, for a power MOSFET with a source-drain breakdown voltage of 600 V, the n-type drift layer 2 is epi-grown to a thickness of 30-50 μm. Furthermore, doping with n-type impurity such as arsenic (As) or phosphorus (P) is performed so that the n-type impurity concentration is on the order of $10^{15}$ cm$^{-3}$.

Figure 5A:
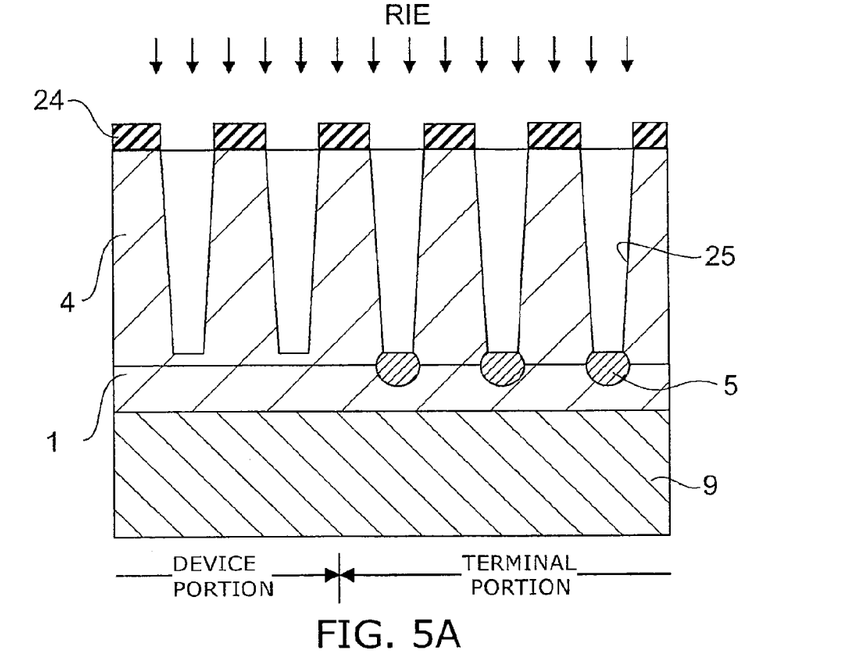
FIGS. 5A and 5B are sectional views schematically showing a process for manufacturing the power semiconductor device according to the first embodiment.

FIG. 5A is a sectional view schematically showing the etching process for forming trench grooves 25 in the n-type drift layer 2.

The trench grooves 25 are formed in the n-type drift layer 2 using a reactive ion etching (RIE) process. As shown in FIG. 5A, an etching mask 24 having several μm wide openings at a predetermined pitch is formed on the surface of the n-type drift layer 2 to etch trench grooves 25. Here, the trench grooves 25 of the terminal portion are formed at positions communicating with the p-type regions 5. Thus, the n-type drift layer 2 is divided into a plurality of n-type pillars 4.

Figure 5B:
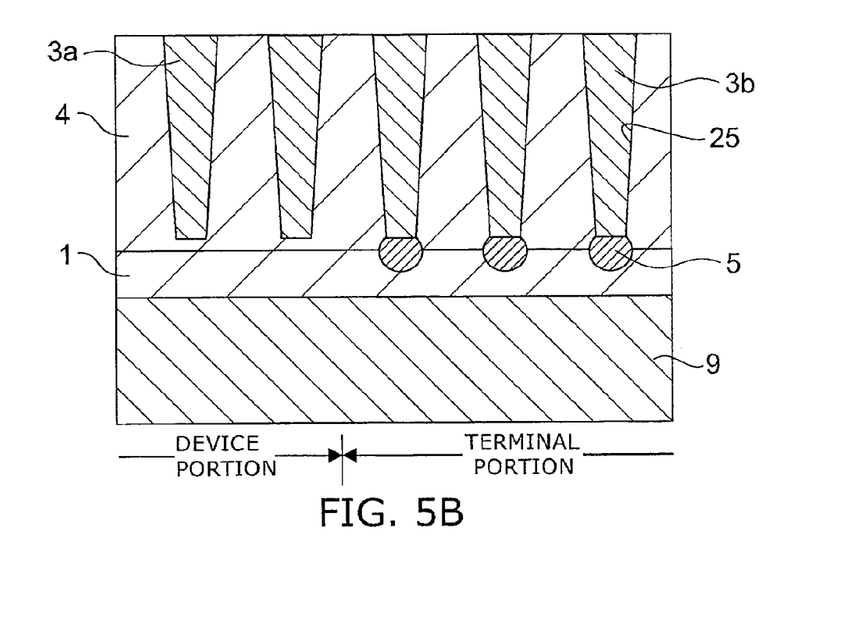

FIG. 5B is a sectional view schematically showing the state in which p-type pillars 3 are formed by filling the trench grooves 25 with p-type semiconductor. In this embodiment, the p-type semiconductor is silicon containing p-type impurity.

In the filling (burying) process, p-type silicon doped with boron as p-type impurity is epi-grown in the trench groove 25 to form a buried region as a p-type pillar 3. The epi-growth may be selective growth in which the p-type silicon is grown only in the trench grooves 25, or may be based on the method of growing p-type silicon entirely on the surface of the wafer 10 to fill the trench grooves 25. After filling the trench grooves 25 by epi-growth of p-type silicon, the surface is preferably planarized by polishing.

Figure 6A:
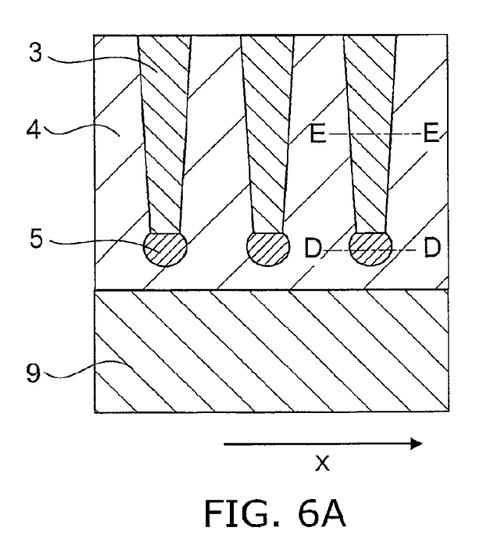
FIGS. 6A to 6C are sectional views schematically showing the SJ structure according to the first embodiment.
Figure 6B:
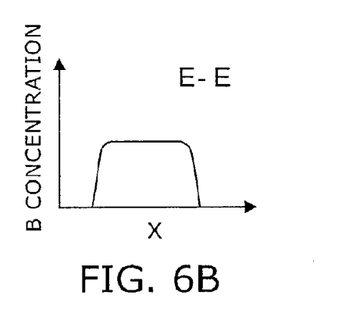
Figure 6C:
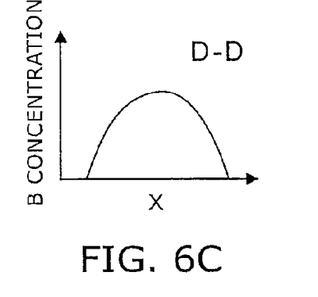

FIGS. 6A to 6C are schematic views showing a cross section of the SJ structure of the terminal portion and impurity concentration profiles of the p-type pillar 3.

As shown in FIG. 6A, p-type pillars 3 filled with p-type silicon and n-type pillars 4 divided by the trench grooves 25 are provided periodically in the lateral direction (X direction shown in the figure). Furthermore, the p-type region 5 is provided at the tip of the p-type pillar 3 on the n$^+$-drain layer 9 side. Furthermore, the p-type pillar 3 is formed in a tapered shape with the width narrowing toward the n$^+$-drain layer 9. Thus, carriers (electrons and holes) can be smoothly ejected from the drift layer having the SJ structure, and hence the pulse response characteristics of the MOSFET can be improved.

The impurity concentration profiles shown in FIGS. 6B and 6C show boron distributions in the E-E cross section of the p-type pillar 3 and the D-D cross section of the p-type region 5, respectively.

In the SJ structure, the amount of impurity is controlled so that when the n-type pillars 4 and the p-type pillars 3 are entirely depleted, the total amount of ions of n-type impurity is balanced with that of p-type impurity, thereby substantially canceling the amount of charge. Hence, the total amount including the amount of boron doped in ion implantation and the amount of boron doped in filling the trench grooves 25 with p-type silicon is balanced with the total amount of n-type impurity in the n-type pillars 4. For instance, in the case where the volume of the n-type pillars 4 is equal to that of the p-type pillars 3, doping is performed so that the concentration of boron doped in the p-type pillars 3 is equal to the n-type impurity concentration of the n-type pillars 4.

However, in the method of forming the p-type pillars 3 by filling the trench grooves 25, the n-type drift layers 1 and 2 to serve as n-type pillars 4 are doped with n-type impurity at the stage of epi-growth. Thus, the p-type region 5 is formed from boron diffused into the n-type drift layer 1 and the n-type drift layer 2 doped with n-type impurity. Hence, boron needs to be doped by the amount of neutralizing the initially doped n-type impurity and an additional amount for reversal to p-type. That is, to form a p-type region having the same concentration as the n-type pillar 4, boron needs to be implanted by the amount corresponding to twice the n-type impurity concentration of the n-type pillar 4. For instance, to equalize the p-type carrier concentration (the concentration in which the n-type impurity concentration is subtracted from the p-type impurity concentration) between the p-type pillar 3 and the p-type region 5, the amount of implantation is determined so that the boron concentration of the p-type region 5 is twice the boron concentration of the p-type pillar 3.

As shown in FIG. 6B, the boron concentration profile (E-E) in the p-type pillar 3 formed by buried growth has a generally trapezoidal shape. On the other hand, as shown in FIG. 6C, the concentration profile (D-D) of the p-type region 5 is formed by redistribution of boron doped by ion implantation, and hence has a generally bowl shape with the peripheral portion sloped more gradually than for the p-type pillar 3.

The boron concentration profile of the p-type region 5 can be calculated by simulation for the theoretical distribution after implantation and the redistribution due to thermal diffusion. In this embodiment, the amount of implanted boron is determined so as to be twice the amount of n-type impurity in the p-type region 5 on the basis of the calculated concentration profile. In this case, the maximum of boron concentration in the p-type region 5 (D-D) is approximately 1.5 times the maximum of boron concentration in the p-type pillar 3 (E-E). Hence, preferably, the maximum of p-type impurity concentration in the p-type region 5 is higher than at least 1.5 times the maximum of p-type impurity concentration in the p-type pillar 3. Thus, the p-type carrier concentration of the p-type region 5 is effectively higher than the p-type carrier concentration of the p-type pillar 3, and the avalanche withstand capability of the SJ structure including the p-type regions 5 can be increased.

Furthermore, as shown in FIGS. 5B and 6A, the p-type pillar 3 is formed in a tapered shape with the width narrowing toward the n$^+$-drain layer 9. Thus, the amount of boron in the p-type pillar 3 is smaller on the n$^+$-drain layer 9 side, which is likely to cause the problem of charge imbalance with respect to the n-type pillar 4. Hence, also to compensate for charge imbalance to improve the avalanche withstand capability, it is preferable to increase the amount of boron doped in the p-type region 5.

Figure 7A:
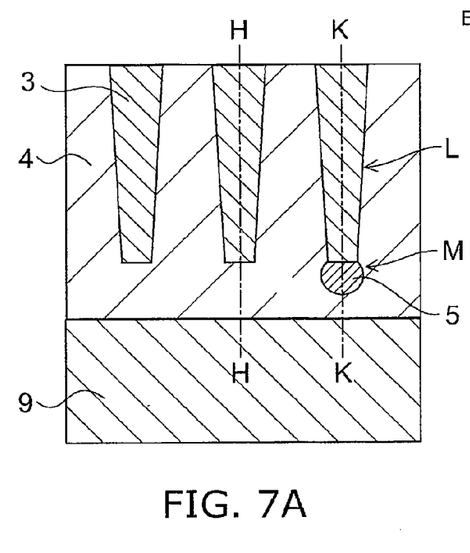
FIGS. 7A to 7C schematically illustrate the electric field distribution of the SJ structure according to the first embodiment.
Figure 7B:
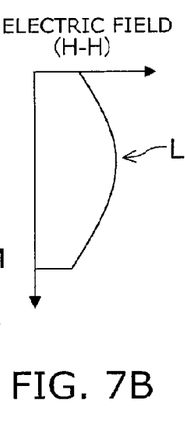
Figure 7C:
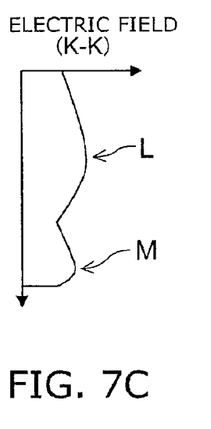

FIGS. 7A to 7C illustrate the electric field distribution at the time when the breakdown voltage is held by the SJ structure. FIG. 7A is a schematic view showing a cross section of the SJ structure. FIG. 7B is a schematic diagram showing the electric field distribution along H-H shown in FIG. 7A, and FIG. 7C is a schematic diagram showing the electric field distribution along K-K.

The length of the p-type pillar 3 from the wafer surface toward the n$^+$-drain layer 9 is nearly equal to the epi-thickness of the n-type drift layer, and illustratively 30-50 μm for a power MOSFET with a source-drain breakdown voltage of 600 V. On the other hand, the lateral width of the p-type pillar 3 is several μm, equal to the width of the trench groove 25. Hence, the p-type pillar 3 has a tapered shape with an aspect ratio of 10 or more, causing charge imbalance between the surface side and the n$^+$-drain layer 9 side. For instance, when a voltage is applied to the p-type pillar 3 shown by H-H in FIG. 7A, depletion begins in the center portion L where the amount of charge is balanced, and the depletion layer extends toward the surface and the n$^+$-drain layer 9. Hence, electric field concentration is likely to occur in the center portion L, exhibiting the electric field distribution as shown in FIG. 7B.

On the other hand, in the p-type pillar 3 shown by K-K in FIG. 7A, the p-type region 5 is provided on the n$^+$-drain layer 9 side. Thus, the amount of charge is balanced also in the pillar lower portion M provided with the p-type region, where electric field concentration occurs. This results in an electric field distribution with peaks in the center portion L and the pillar lower portion M as shown in FIG. 7C. In both of the electric field distributions shown in FIGS. 7B and 7C, the value of electric field is maximized in the center portion L. However, the maximum electric field in FIG. 7C having another peak in the pillar lower portion M is smaller than the maximum electric field in FIG. 7B. That is, by providing the p-type region 5 according to this embodiment, the electric field in the pillar lower portion increases, alleviating the electric field concentration in the center portion and achieving the effect of reducing leak current and preventing local avalanche breakdown.

Second Embodiment

Figure 8:
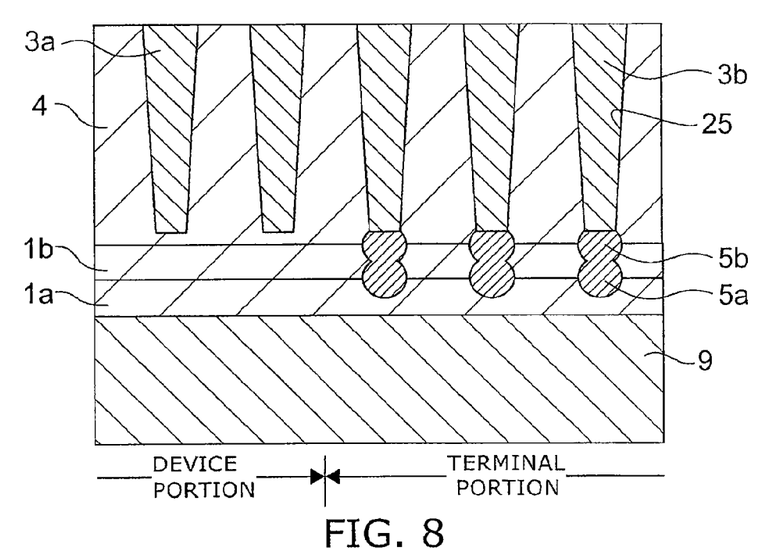
FIG. 8 is a schematic view showing a cross section of a wafer according to a second embodiment of the invention.

FIG. 8 is a sectional view schematically showing a cross section of a wafer according to a second embodiment.

In this embodiment, the terminal portion has a configuration in which two p-type regions 5a and 5b are stacked in the direction perpendicular to the major surface of the n$^+$-drain layer 9. Thus, the length of the p-type region 5 in the direction toward the n$^+$-drain layer 9 is longer than in the first embodiment (see FIG. 5B), and the breakdown voltage of the SJ structure of the terminal portion can be further increased.

The wafer having the cross-sectional structure shown in FIG. 8 can be easily manufactured by repeating the impurity doping process shown in FIG. 4A and the epi-growth process shown in FIG. 4B. Alternatively, the epi-grown drain layers is and 1b (third semiconductor layers) can be undoped layers not doped with n-type impurity, and n-type pillars 4 may be formed by ion implantation of n-type impurity in the portion of the drain layers 1a, 1b where the p-type regions 5a, 5b are not formed. This method has the advantage of being able to easily achieve charge balance between the p-type region 5a, 5b and the n-type pillar 4.

Two or more p-type regions 5 can be stacked in the direction perpendicular to the major surface of the n$^+$-drain layer 9. Furthermore, the length of the p-type pillar 3 can be made different between in the device portion and in the terminal portion. However, it may be understood that the cost advantage of the method of forming p-type pillars by filling trench grooves decreases with the increase in the number of stacked p-type regions 5. Hence, it is preferable to design a configuration with a suitable number of p-type regions 5 stacked therein by taking into consideration the breakdown voltage difference required between the device portion and the terminal portion.

Third Embodiment

Figure 9:
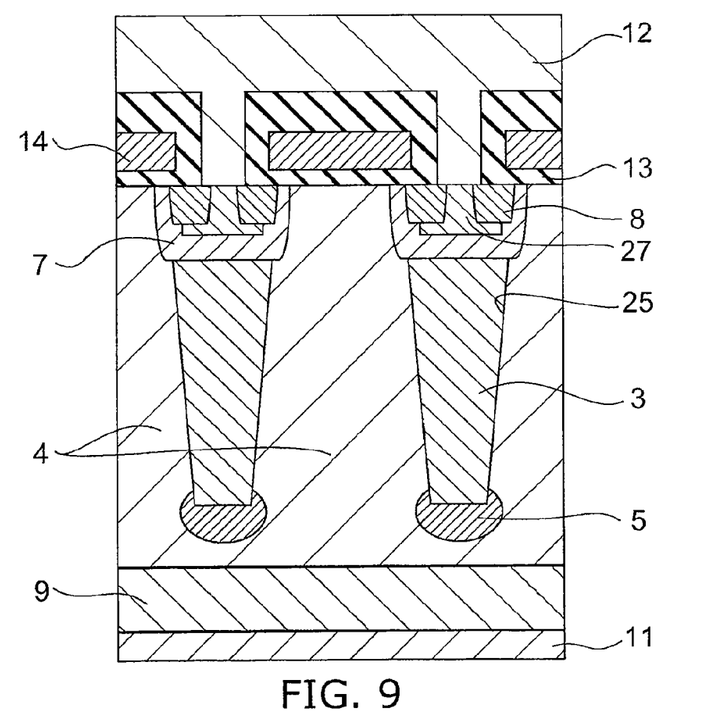
FIG. 9 is a schematic view showing a cross section of a unit cell of a power semiconductor device according to a third embodiment of the invention.

FIG. 9 is a sectional view schematically showing a unit cell of a power MOSFET according to a third embodiment.

A p-type pillar 3 filling a trench groove 25 is provided in communication with each of p-type regions 5 provided with lateral periodicity. The p-type pillars 3 and n-type pillars 4 are provided with lateral periodicity, and a p-type base 7 is provided on the surface of the p-type pillar 3. Furthermore, an n-type source 8 and a p-type contact region 27 are selectively provided in the surface of the p-type base 7. That is, the MOSFET according to this embodiment has a structure including the p-type region 5 also in the device portion.

The structure further includes a drain electrode 11 electrically connected to the n$^+$-drain layer 9, a gate insulating film 13 provided on the n-type pillar 4, the p-type base 7, and the n-type source 8, a gate electrode 14 provided via the gate insulating film 13 above the n-type pillar 4, the p-type base 7, and the n-type source 8, and a source electrode 12, which is a second main electrode joined to the surface of the p-type contact region 27 and the n-type source 8.

As shown in FIG. 9, by the SJ structure with the n-type pillars 4 and the p-type pillars 3 alternately arranged therein, and furthermore by the p-type region 5 provided on the drain electrode 11 side of the p-type pillar 3, the concentration of p-type impurity doped in the p-type region 5 and in the p-type pillar 3 can be independently varied. Thus, also in the SJ structure manufactured by filling the trench grooves 25, the impurity concentration of p-type pillars can be easily varied. For instance, the impurity concentration of the p-type region 5 can be made higher than the impurity concentration of the p-type pillar 3 to improve the avalanche withstand capability.

The first to third embodiment have been described above. However, the invention is not limited to the above embodiments. For instance, in the above description, the first conductivity type is n-type, and the second conductivity type is p-type. However, the invention is practicable also when the first conductivity type is p-type and the second conductivity type is n-type.

Furthermore, in the above configuration, the p-type pillar 3 is not in contact with the n$^+$-drain layer 9. However, the invention is practicable also in a configuration in which the p-type pillar 3 is in contact with the n$^+$-drain layer 9. Furthermore, the invention is practicable also when an n$^-$-layer having a lower concentration than the n-type pillar 4 is formed between the p-type pillar 3 and the n$^+$-drain layer 9.

In the foregoing, the MOSFET using silicon (Si) as a semiconductor material has been described. However, for instance, compound semiconductors such as silicon carbide (SIC) and gallium nitride (GaN), and wide bandgap semiconductors such as diamond can be used. Furthermore, besides MOSFETs, the invention is also applicable to any devices having the SJ structure, such as a hybrid device of MOSFET and SBD (Schottky barrier diode), and an IGBT (insulated gate bipolar transistor).

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A power semiconductor device comprising:
    a first semiconductor layer of a first conductivity type;
    first semiconductor regions of a second conductivity type filling trench grooves formed with periodicity in a lateral direction in a second semiconductor layer of the first conductivity type, which is provided on a major surface of the first semiconductor layer in a device portion with a main current path formed in a vertical direction generally perpendicular to the major surface of the first semiconductor layer and in a terminal portion provided around the device portion;
    a second semiconductor region of the first conductivity type, which is a portion of the second semiconductor layer sandwiched between adjacent ones of the first semiconductor regions; and
    third semiconductor regions of the second conductivity type provided below the first semiconductor regions in communication with the first semiconductor regions in the terminal portion,
    wherein the third semiconductor regions have a width that is greater than a width of a base of the first semiconductor regions provided in the device portion, and
    a concentration of impurities of the second conductivity type doped in the third semiconductor regions decreases more gradually from each of the third semiconductor regions toward the second semiconductor layer at a boundary therebetween than a concentration of impurities of the second conductivity type doped in the first semiconductor regions which decrease from each of the first semiconductor regions toward the second semiconductor region at a boundary therebetween.

2. The device according to claim 1, wherein a carrier concentration profile of the second conductivity type in the third semiconductor regions has a maximum, and the maximum carrier concentration is higher than a carrier concentration of the second conductivity type in the first semiconductor regions.

3. The device according to claim 1, wherein an impurity concentration profile of the second conductivity type doped in the third semiconductor regions has a maximum, and the maximum impurity concentration is greater than 1.5 times an impurity concentration of the second conductivity type in the first semiconductor regions.

4. The device according to claim 1, wherein the first semiconductor regions are provided in a tapered shape with a width in the lateral direction narrowing toward the first semiconductor layer.

5. The device according to claim 1, wherein the first semiconductor regions and the third semiconductor regions are provided in a striped configuration extending along the major surface of the first semiconductor layer.

6. The device according to claim 5, wherein the first semiconductor regions in the striped configuration are provided at an identical pitch in the device portion and the terminal portion.

7. The device according to claim 5, wherein the first semiconductor regions provided in the striped configuration extend from the device portion to the terminal portion and communicate with the third semiconductor regions in the terminal portion.

8. The device according to claim 1, further comprising:
    gate electrodes provided in the device region;
    a field oxide film provided along an outer periphery of the device portion on the first semiconductor regions and the second semiconductor regions in the terminal portion; and
    a field plate provided on the field oxide film in the terminal portion, and electrically connected to the gate electrodes.

9. The device according to claim 1, further comprising:
    a fifth semiconductor region of the second conductivity type provided on the first semiconductor regions and the second semiconductor region in the terminal portion along an outer periphery of the device portion.

10. The device according to claim 1, wherein a plurality of the third semiconductor regions are stacked in a direction generally perpendicular to the major surface of the first semiconductor layer in the terminal portion.

11. The device according to claim 1, wherein the first conductivity type is n-type, and the second conductivity type is p-type.

* * * * *